United States Patent
Ohtsu et al.

(10) Patent No.: US 6,797,531 B2
(45) Date of Patent: Sep. 28, 2004

(54) PROCESS FOR PRODUCING MICROLENS ARRAY, ARRAY MASTER, ELECTROLYTIC SOLUTION AND MICROLENS ARRAY RESIN MATERIAL THEREFOR AND APPARATUS FOR PRODUCING MASTER

(75) Inventors: Shigemi Ohtsu, Nakai-machi (JP); Keishi Shimizu, Nakai-machi (JP); Kazutoshi Yatsuda, Nakai-machi (JP); Eiichi Akutsu, Nakai-machi (JP)

(73) Assignee: Fuji Xerox Co., Ltd., Tokyo (JP)

( * ) Notice: Subject to any disclaimer, the term of this patent is extended or adjusted under 35 U.S.C. 154(b) by 0 days.

(21) Appl. No.: 10/462,616

(22) Filed: Jun. 17, 2003

(65) Prior Publication Data
US 2004/0001259 A1 Jan. 1, 2004

(30) Foreign Application Priority Data
Jun. 26, 2002 (JP) ...................... 2002-186057

(51) Int. Cl.⁷ .............................. H01L 21/00
(52) U.S. Cl. ......................... 438/29; 359/620
(58) Field of Search ................. 359/619, 620; 438/29

(56) References Cited

U.S. PATENT DOCUMENTS 6,707,612 B2 * 3/2004 Ohtsu et al. ................ 359/620

2003/0227688 A1 * 12/2003 Houlihan et al. .......... 359/619

FOREIGN PATENT DOCUMENTS

| JP | A 10-119414 | 5/1998 |
|----|-------------|--------|
| JP | A 11-105418 | 4/1999 |
| JP | A 11-133224 | 5/1999 |
| JP | A 11-174790 | 7/1999 |
| JP | A 11-189899 | 7/1999 |
| JP | A 11-335894 | 12/1999 |
| JP | A 2001-140096 | 5/2001 |

* cited by examiner

Primary Examiner—W. David Coleman
(74) Attorney, Agent, or Firm—Oliff & Berridge, PLC

(57) ABSTRACT

A processing for producing a microlens array is provided, the process contains the steps of: producing a microlens array master by the photo-electrodeposition method or the photocatalytic method using a substrate for forming a microlens array master containing an insulating substrate having thereon an electroconductive thin film and a photosemiconductor thin film; producing a template by forming a layer of a template resin material on the surface of the master, followed by releasing; and forming a layer of a microlens array resin material having a controlled refractive index on the template, followed by releasing.

17 Claims, 3 Drawing Sheets

PROCESS FOR PRODUCING MICROLENS ARRAY, ARRAY MASTER, ELECTROLYTIC SOLUTION AND MICROLENS ARRAY RESIN MATERIAL THEREFOR AND APPARATUS FOR PRODUCING MASTER

BACKGROUND OF THE INVENTION

1. Field of the Invention

The present invention relates to a process for producing a microlens array being able to condense light at a high efficiency, an electrolytic solution therefor, and an apparatus for producing a microlens array.

2. Description of Related Art

As a process for producing a microlens array, such methods have been used as a dry etching method, represented by a reactive ion etching method (RIE method), a lithography method using emitted light or an X-ray (LIGA method), a focused ion beam method (FIB method), a doping method of a high refractive index material by thermal diffusion, a method of melting a resist film by heating (resist flow method), and a method of casting a plastic material in a mold previously formed by the RIE method to form a microlens array (stamper method).

The RIE method, the LIGA method and the FIB method require an expensive apparatus and a prolonged etching time to cause high cost.

The doping method of a high refractive index material by thermal diffusion has an advantage of the use of a flat plate, but it suffers some limitations that the shape and the curvature of the lenses were restricted since they are controlled only by the refractive index, and it can be applied only to a heat resistant material, i.e., a glass substrate.

The resist flow method is preferred as a method of directly forming on a CCD, but it is limited in the shape of the lenses and is not suitable for a microlens for collimation.

The method of preparing a mold previously formed can reduce the production cost, but it has such a problem in that the formation of the mold requires the expensive RIE method.

In all the methods, it is the current situation that high production cost is required upon producing a microlens array having a large area and a high density, and there is no production method of microlenses that is simple and has high degree of freedom.

A method of implanting microbeads in a binder resin is known as a low cost method. Although it is advantageous in mass production and production in large areas, it has such a problem in that it is difficult that the microbeads are uniformly arranged.

The inventors have proposed a process for forming an image excellent in resolution and a process for producing a color filter, in which electrodeposition or photoelectrodeposition are carried out at a low voltage application by using an electrodeposition material containing a colored material. The processes are disclosed in detail in JP-A-10-119414, JP-A-11-189899, JP-A-11-105418, JP-A-11-174790, JP-A-11-133224 and JP-A-11-335894. The process for forming an image and the process for producing a color filter have such characteristic features that a colored film with high resolution can be formed in a convenient method, but they are the techniques that are mainly applied to the field of a display device, such as a liquid crystal display device.

The inventors have also proposed a photocatalytic film deposition method capable of forming a colored film, such as a color filter, with high resolution by the convenient method as similar to the foregoing methods (disclosed in JP-A-2001-140096).

On the other hand, a microlens array is used as an optical element, such as a condenser lens, as well as a display device, such as a liquid crystal projector. Furthermore, as described in the foregoing, it is the current situation that a microlens array is produced by micro fabrication through complicated process steps including a photolithography method of a photosensitive material, and there is no attempt to produce a microlens array by an electrodeposition method using no complicated process, such as the RIE method.

SUMMARY OF THE INVENTION

The invention has been made in view of the foregoing problems associated with the conventional art and is to provide a process for producing a microlens array that can produce a microlens array with low cost in a convenient method and can freely adjust the density of the microlenses, and an electrolytic solution and a production apparatus therefor.

The invention relates to, as one aspect, a process for producing a microlens array containing the steps of: arranging a master substrate having an insulating substrate, an electroconductive thin film and a photosemiconductor thin film in this order, preparing an aqueous electrolytic solution containing a film forming material having a solubility of dispersibility in an aqueous liquid decreasing upon changing pH; forming a microlens array master by contacting the semiconductor with the aqueous electrolytic solution and irradiating the photosemiconductor thin film with a light so as to induce the pH change of the electrolytic solution enough to selectively deposit the film forming material on the master substrate; forming a layer of a template resin material on a surface of the master and releasing the layer therefrom to produce a template; and forming a layer of a microlens array resin material having a controlled refractive index on the template and releasing the template therefrom to produce a microlens array.

The invention also relates to, as another aspect, a process for producing a microlens array containing the steps of: arranging a master substrate having an insulating substrate, an electroconductive thin film and a photosemiconductor thin film in this order, preparing an aqueous electrolytic solution containing a film forming material having a solubility or dispersibility in an aqueous liquid decreasing upon changing pH; forming a microlens array master by contacting the photosemiconductor thin film and the electroconductive thin film with the aqueous electrolytic solution and irradiating the photosemiconductor thin film with a light so as to induce the pH change of the electrolytic solution enough to selectively deposit the film forming material on the master substrate; forming a layer of a template resin material on a surface of the master and releasing the layer therefrom to produce a template; and forming a layer of a microlens array resin material having a controlled refractive index on the template and releasing the template therefrom to produce a microlens array.

BRIEF DESCRIPTION OF THE DRAWINGS

A preferred embodiment of the invention will be described in detail based on the following figures wherein.

DETAILED DESCRIPTION OF THE PREFERRED EMBODIMENTS

In the invention, a microlens array is produced in the following manner. A master of a microlens array is produced by using the photo-electrodeposition methods disclosed in JP-A-10-119414, JP-A-11-189899, JP-A-11-105418, JP-A-11-174790, JP-A-11-133224 and JP-A-11-335894 or the photocatalytic film deposition method disclosed in JP-A-2001-140096, and then a template is produced by forming a layer of a template resin material on the master, followed by releasing. Thereafter, a microlens array is duplicated from the template by forming a layer of a microlens array resin material having a controlled refractive index on the template, followed by releasing.

In the process for producing a microlens array according to the invention, a microlens array master is produced in a simple method with low cost, a template is produced from the master, and a microlens array is duplicated and produced by using the template. Therefore, a large number of microlens arrays can be efficiently mass-produced with low cost by using the template.

The master is produced by the photo-electrodeposition method (including the photocatalytic method), and in the film formation by the methods, the thickness of the film thus obtained corresponds to the amount of light irradiated on the photosemiconductor thin film. Therefore, the selected region of the photosemiconductor thin film is irradiated with light in a prescribed amount that is adjusted to form such a film thickness that corresponds to the cross sectional shape of the respective microlenses, whereby a microlens array master having a prescribed cross sectional shape can be conveniently produced. Furthermore, such features can be easily obtained owing to the use of the photo-electrodeposition method in that the pattern density of the master is increased, the density is arbitrarily controlled, a minute pattern is formed with high resolution, and an arbitrary pattern including a complex pattern is formed. Moreover, the respective microlenses of the resulting master have refined shapes.

Therefore, a microlens array produced by using such a master has a high density that can be freely adjusted, has a minute pattern formed with high resolution, and has an arbitrary pattern including a complex pattern. Furthermore, respective lenses of the microlens array have refined shapes. Moreover, the lenses exhibit a high light condensing efficiency.

In the conventional production process of a microlens array using a photosensitive resin, it is necessary that the resin is coated on a substrate with a thickness that is accurately controlled, and a problem is caused by emitting an alkaline waste liquid through etching. In the invention, on the other hand, lenses having uniform shapes can be conveniently produced, and no etching process is required for forming a pattern, whereby the load on the environment can be reduced.

Figure 1A:
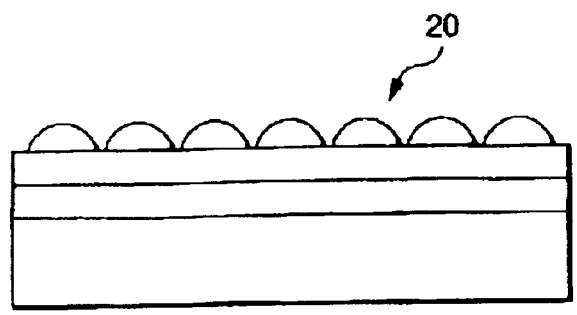
FIGS. 1A to 1E are conceptual cross sectional views showing examples of process steps of the process for producing a microlens array according to the invention.
Figure 1B:
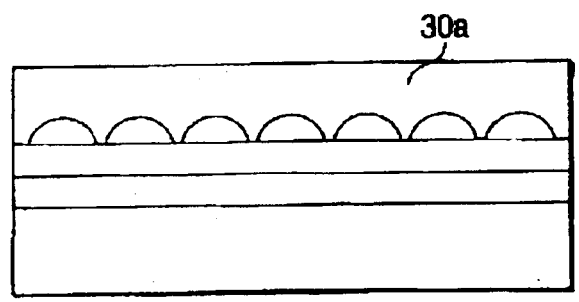
Figure 1C:
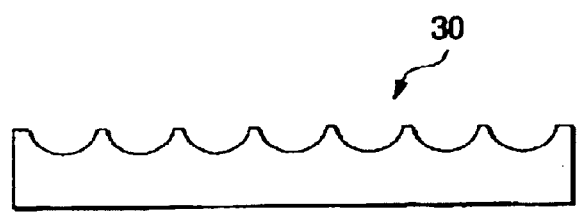
Figure 1D:
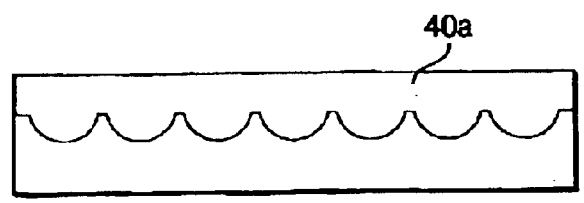
Figure 1E:
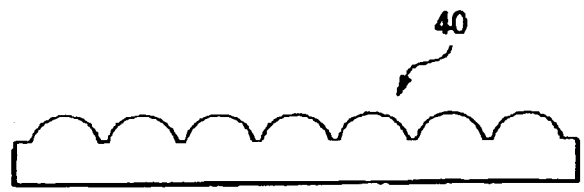

The production process of a microlens array according to the invention will be described with reference to FIGS. 1A to 1E. A microlens array master 20 is produced according to the invention, the details of which will be described later (as shown in FIG. 1A). A layer of a template resin material 30a is formed on the microlens array master 20 (as shown in FIG. 1B). The assembly having the structure shown in FIG. 1B is released at the interface between the surface of the microlens array master 20 and the layer of the template resin material 30a to obtain a template 30 (as shown in FIG. 1C). A layer of a microlens array resin material 40a is formed on the template 30 of FIG. 1C (as shown in FIG. 1D). Thereafter, the assembly having the structure shown in FIG. 1D is released at the interface between the template 30 and the layer of the microlens array resin material 40a solidified to obtain a microlens array 40 (as shown in FIG. 1E).

The respective process steps will be described in more detail.

Production of Microlens Array Master

The photo-electrodeposition method utilizes photovoltaic force generated in a photosemiconductor thin film, in which the following procedures are carried out. A substrate containing an insulating substrate having accumulated thereon an electroconductive thin film and a photosemiconductor thin film in this order is arranged in an aqueous electrolytic solution containing a film forming material having a solubility or a dispersibility in an aqueous liquid decreasing upon changing pH, so as to make at least the photosemiconductor thin film in contact with the electrolytic solution. While maintaining the arranged state, a selected region of the photosemiconductor thin film is irradiated with light, whereby a voltage is applied between the selected region of the photosemiconductor thin film and a counter electrode to deposit the material on the selected region of the photosemiconductor thin film. The photo-electrodeposition method has such an advantage in comparison to the conventional electrodeposition method that a film having a uniform thickness can be obtained at a low voltage (5 V or lens) with high accuracy.

The photocatalytic film deposition method utilizes a photocatalytic function of a photosemiconductor thin film, which is described in detail in the paragraphs 0025 to 0029 of JP-A-2001-140096. In the production process of a microlens array using the method, a electrolytic solution similar to the electrolytic solution used in the photo-electrodeposition method is used, and such a substrate for forming a microlens array master is used that contains an insulating substrate having accumulated thereon an electroconductive thin film and a photosemiconductor thin film in contact with the electroconductive thin film, in which the electroconductive thin film is capable of electrically connecting to the electrolytic solution (as described in the paragraph 0026 of the publication). Furthermore, the substrate for forming a microlens array master is arranged in the electrolytic solution to make the photosemiconductor thin film thereof in contact with the electrolytic solution, and the electroconductive thin film is made in electrical connection with the electrolytic solution (as described in the paragraph 0026 of the publication). Under maintenance of the state thus arranged, a selected region of the photosemiconductor thin film is irradiated with light to deposit the material on the selected region of the photosemiconductor thin film, so as to produce a microlens array layer.

In the production process of a microlens array using the method, the film can be formed by using a more convenient apparatus with lower cost because neither electrodeposition apparatus nor additional electrode for electrodeposition is required. Furthermore, a microlens array thus produced by the process attains such high quality that is equivalent to that obtained by the photo-electrodeposition method.

Because the photo-electrodeposition method or the photocatalytic film deposition method is used in the process step for producing a microlens array master of the invention, such a microlens array master can be conveniently obtained with low cost that has a high density (50,000 or more per square centimeter for microlens having a diameter of 30 μm) and uniform lens shapes.

In the conventional production process of a microlens array master by the photolithography method using a photosensitive resin, such problems arise in that it is necessary that a photosensitive resin is coated on a substrate with a thickness that is accurately controlled, and an alkaline waste liquid as an etching solution is emitted in the developing step. According to the invention, however, such problems are not brought about upon production of a microlens array master.

The substrate for forming a microlens array master used in the photo-electrodeposition method contains an insulating substrate accumulated thereon an electroconductive thin film and a photosemiconductor thin film in this order. Examples of the insulating substrate include a glass plate, a quartz plate, a plastic film and an epoxy resin board. Examples of the electroconductive thin film include ITO, indium oxide, nickel and aluminum. Examples of the photosemiconductor thin film includes a titanium oxide thin film described later. In the case where irradiation with light on the photosemiconductor thin film is carried out through the insulating substrate, it is necessary that the insulating substrate and the electroconductive thin film have light transmissibility. However, they may not have the same in the case where irradiation with light on the photosemiconductor thin film is carried out through the electrolytic solution.

The insulating substrate, the electroconductive thin film and the photosemiconductor thin film of the substrate forming a microlens array master used in the photocatalytic film deposition method may be those similar to that used for production of the substrate using the photo-electrodeposition method. However, it is necessary in the substrate for this method that the electroconductive thin film is in contact with the photosemiconductor thin film, and the electroconductive thin film is capable of electrically connecting to the electrolytic solution.

Figure 2:
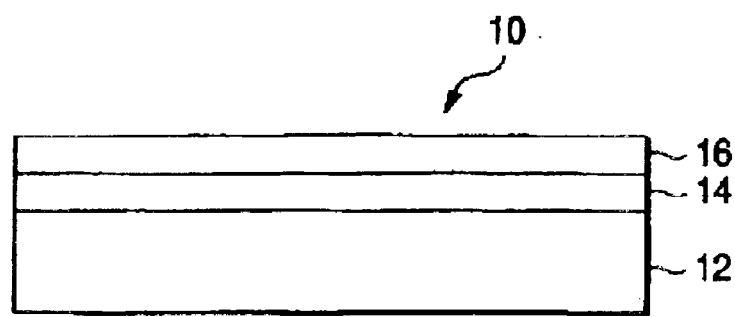
FIG. 2 is a conceptual cross sectional view showing an example of production of a substrate for forming a microlens array master.

FIG. 2 shows an example of the substrate for forming a microlens array master used in the invention. In the figure, numeral 10 denotes the substrate for forming a microlens array master, 12 denotes the insulating substrate, 14 denotes the electroconductive thin film, and 16 denotes the photosemiconductor thin film. The substrate for forming a master shown in the figure is used in both the photo-electrodeposition method and the photocatalytic film deposition method.

The photosemiconductor thin film (photocatalytic thin film) used in the invention will be described. As the photosemiconductor thin film used in the photo-electrodeposition method and the photocatalytic film deposition method, any transparent thin film semiconductor having a function of generating electromotive force upon irradiation with light or having a photocatalytic function can be basically used. Specific examples of the semiconductor include GaN, diamond, c-BN, SiC, ZnSe, $TiO_2$, ZnO, $In_2O_3$ and $SnO_2$. Among these, titanium oxide can be used as it is as a substrate for forming an optical device because it exhibits absorption only in a region of 400 nm or less, is transparent, and can easily form an n-type semiconductor.

Examples of the method for providing a titanium oxide semiconductive thin film on the substrate include a thermal oxidation method, a sputtering method, an electron beam vapor deposition method (EB method), an ion plating method and a sol-gel method, and an n-type semiconductor having good characteristics can be obtained by these methods.

However, in the case where the substrate has low heat resistance, such as a plastic film, it is necessary to employ such a film forming method that causes no adverse affect on the plastic film. The sol-gel method can form a titanium oxide film having high optical activity as a photosemiconductor, but because the method requires baking at 500° C., it is difficult to form a titanium oxide film on a plastic film substrate, which has heat resistance until only about 200° C.

Therefore, in the case where a plastic film substrate is used, the sputtering method, particularly an RF sputtering method, is preferably used, in which the film formation can be carried out at a temperature as low as possible, preferably 200° C. or lens, and damages caused on the substrate are relatively small. The RF sputtering method is particularly preferred because an anatase type titanium oxide thin film having high optical activity can be obtained. The electron beam method and the ion plating method are not preferred because the substrate is heated to about 200° C.

The electrolytic solution used in the photo-electrodeposition method and the photocatalytic film deposition method in the invention contains at least such a film forming material that has a solubility or a dispersibility in an aqueous liquid decreasing upon changing pH, so as to deposit a film from the electrolytic solution on the photosemiconductor thin film. In the case where at least one of film forming material has such a film deposition property, various kinds of materials having no film forming function by themselves dispersed in the electrolytic solution can be incorporated in the film forming material upon forming the film, whereby they are fixed in the microlens array master.

The film forming material having a solubility or a dispersibility in an aqueous liquid decreasing upon changing pH preferably contains a substance having, in molecules thereof, a group, the ionic dissociation degree of which is changed upon changing the pH of the liquid (ionic group), such as a carboxyl group and an amino group. However, the presence of the ionic group is not essential to the material, and the polarity of the ion is arbitrarily selected.

The film forming material having a solubility or a dispersibility in an aqueous liquid decreasing upon changing pH is preferably a polymer material from the standpoint of mechanical strength of the microlens array means. Examples of the polymer material include a polymer material having the ionic group (ionic polymer).

It is necessary that the ionic polymer has a sufficient solubility or a sufficient dispersibility to an aqueous liquid (including an aqueous liquid having been adjusted in pH).

In order to impart the function of decreasing a solubility or a dispersibility in an aqueous liquid upon changing pH to the polymer material, the polymer material preferably contains a hydrophilic group and a hydrophobic group in the molecule thereof, and as the hydrophilic group, a group capable of being an ion (hereinafter simply referred to as an "ionizing group"), such as a carboxyl group (anionic group) and an amino group (cationic group) is preferably introduced. For example, in the case of a polymer material containing a carboxyl group, the carboxyl group is in a dissociation state, and the material is dissolved in the aqueous liquid when the pH is in an alkali region, but the dissociation state is disappeared in the acidic region, whereby the solubility is decreased, and the material is deposited.

The hydrophobic group present in the polymer material imparts such a function to the polymer material in that a film is immediately deposited upon changing pH, in correlation with the loss of ionicity of the group having been ionically dissociated. Examples of the hydrophilic group include a hydroxyl group, as well as the ionizing group.

The number of the hydrophobic group in the polymer material containing the hydrophilic group and the hydrophobic group is preferably in a range of from 30 to 80% based on the total number of the hydrophilic group and the hydrophobic group. In the case of a material having a number of the hydrophobic group of less than 30% based on the total number of the hydrophilic group and the hydrophobic group, a film thus formed is liable to suffer redissolution, and there are some cases where the water resistance and the strength of the film are insufficient. In the case of a material having a number of the hydrophobic group exceeding 80% based on the total number of the hydrophilic group and the hydrophobic group, the solubility of the polymer material in an aqueous liquid becomes insufficient, whereby the electrolytic solution is turbid, precipitates of the material are formed, and the viscosity of the electrolytic solution is increased. Therefore, the number of the hydrophobic group is preferably in the foregoing range. The number of the hydrophobic group is more preferably in a range of from 55 to 70% based on the total number of the hydrophilic group and the hydrophobic group. An electrolytic solution containing a polymer material having the number of hydrophobic group in this range particularly exhibits high deposition efficiency of the film and high stability in liquid condition. Furthermore, the film formation is possible even when a low electrodeposition potential as equivalent to a photoelectric electromotive force is applied.

Examples of the polymer material include a material obtained by copolymerizing a polymerizable monomer having a hydrophilic group and a polymerizable monomer having a hydrophobic group.

Examples of the polymerizable monomer having a hydrophilic group include methacrylic acid, acrylic acid, hydroxyethyl methacrylate, acrylamide, maleic anhydride, fumaric acid, propiolic acid, itaconic acid and derivatives thereof, but it is not limited to these examples. Among these, in particular methacrylic acid and acrylic acid are useful hydrophilic monomers because they exhibit high film deposition efficiency upon changing pH.

Examples of the polymerizable monomer having a hydrophobic group include an alkene, styrene, $\alpha$-methylstyrene, $\alpha$-ethylstyrene, methyl methacrylate, butyl methacrylate, acrylonitrile, vinyl acetate, ethyl acrylate, butyl acrylate, lauryl methacrylate and derivatives thereof, but it is not limited to these examples. In particular, because styrene and $\alpha$-methylstyrene have high hydrophobicity, a polymer material containing these monomers is liable to exhibit hysteresis characteristics (a film is deposited from an electrolytic solution with a small change in pH, but the film having been deposited does not suffer redissolution with a certain extent of change in pH), and that these are useful hydrophobic monomers.

As the polymer material used in the process step of producing a microlens array master, such a copolymer is preferably used that is formed with acrylic acid or methacrylic acid as a monomer containing a hydrophilic group and styrene or $\alpha$-methylstyrene as a monomer containing a hydrophobic group.

As the polymer material used in the process step of producing a microlens array master, it is preferred to use a copolymer formed by copolymerizing monomers containing a hydrophilic group and a hydrophobic group, respectively, and it is more preferred to use a copolymer formed by copolymerizing the monomers to make the ratio of the hydrophilic group and the hydrophobic group in the polymer within the foregoing range. The numbers of kinds of the hydrophilic group and the hydrophobic group contained in the polymer material are not limited to one kind, respectively.

In the polymer material used in the invention, a crosslinking group may be introduced to make a crosslinkable polymer material, which can be crosslinked by a heat treatment after the electrodeposition, so as to improve the mechanical strength and the heat resistance of the microlens array master.

Examples of the crosslinking group include an epoxy group, a blocked isocyanate group (including a group capable of being an isocyanate group), a cyclocarbonate group and a melamine group. Therefore, as the polymer material, for example, a material obtained by copolymerizing a polymerizable monomer having a crosslinking group, a polymerizable monomer having a hydrophilic group and a monomer having a hydrophobic group is preferably used.

Examples of the polymerizable monomer having a crosslinking group include glycidyl (meth)acrylate, (meth) acrylic acid azide, 2-(O-(1'-methylpropylideneamino) carboxyamino)ethyl methacrylate (Karenz MOI-BN, a trade name, produced by Showa Denko Co., Ltd.), 4-((meth) acryloxymethyl)ethylene carbonate and (meth) acryloylmelamine. These crosslinking monomers are generally contained in the film deposition polymer compound in an amount of from 1 to 20% by mole while it varies depending on the kind of the monomer used.

The polymer material preferably has a polymerization degree of from 6,000 to 25,000, and in this range, a deposited film in good conditions can be formed by the polymer material. More preferably, the polymerization degree is from 9,000 to 20,000. When the polymerization degree is less than 6,000, the film is liable to suffer redissolution. When the polymerization degree exceeds 25,000, the solubility in an aqueous liquid becomes insufficient to cause such problems in that the liquid is turbid, and precipitates are formed.

In the case where the polymer material has an anionic group, such as a carboxyl group, the polymer material can exhibit good film deposition characteristics when the polymer material has an acid value in a range of from 60 to 300. The acid value is more preferably in a range of from 90 to 195. When the acid value of the polymer material is less than 60, the solubility of the polymer material in an aqueous liquid becomes insufficient to cause such problems in that the solid concentration of the electrolytic solution cannot be increased to a prescribed value, the liquid is turbid to form precipitates, the viscosity of the liquid is increased. When the acid value exceeds 300, the film thus deposited is liable to suffer redissolution. Therefore, the acid value of the polymer material is preferably in the foregoing range.

It is preferred that the change in liquid condition, i.e., change of the dissolved state or the dispersed state to a state where a supernatant is formed to cause precipitates, corresponding to the pH value of the electrolytic solution having the polymer material dissolved therein is caused within a pH range of 2 or less. When the pH range is 2 or less, immediate deposition of a film is possible upon rapid pH change, and such advantages are obtained in that the film thus deposited has a high cohesive force, and the redissolution rate of the deposited film in the electrolytic solution is lower. According to the advantages, a microlens array master having respective microlenses with refined shape in a high density can be obtained.

In the case where the pH range exceeds 2, reduction of the film deposition rate for obtaining a sufficient film structure and lack of water resistance of the film, which causes reduction of resolution, are liable to occur. The pH range of 1 or less provides more preferred characteristics.

Furthermore, in the film formation by electrodeposition, it is preferred that the state change of forming precipitates (deposition) corresponding to change in pH rapidly occurs in the electrolytic solution having the polymer material dissolved therein, and in addition, the film thus deposited is difficult to suffer redissolution. The phenomenon is generally referred to as so-called hysteresis characteristics. The hysteresis characteristics in the case of an anionic polymer material mean that deposition rapidly occurs upon reduction in pH, but even when the pH is increased (for example, upon completion of electrodeposition or termination of light irradiation in the photocatalytic film deposition method), redissolution of the deposited film does not rapidly occur, and the deposited state is maintained for a certain period of time. When the electrodeposition is carried out by using a polymer material exhibiting no hysteresis characteristics, on the other hand, the deposited film is liable to suffer redissolution even on slight increase in pH.

The polymer material having the characteristics described in the foregoing can be obtained by appropriately adjusting such parameters as the kinds of the hydrophilic group and the hydrophobic group, the balance of the hydrophilic group and the hydrophobic group, the acid value and the molecular weight. The polymer material contained in the electrolytic solution used in the invention may be an arbitrary combination of those materials described in the foregoing as far as the thin film formation performance is not impaired, and examples thereof include a mixture of molecules having the same polarity, such as two or more kinds of anionic molecules, and a mixture of molecules having different polarities, such as a mixture of an anionic molecule and a cationic molecule.

The electroconductivity of the electrolytic solution will be then described. The electroconductivity relates to the film deposition rate, i.e., the film deposition amount, and the film thickness deposited for a prescribed period of time is increased with increase of the electroconductivity and is saturated at about 20 mS/cm. Therefore, in the case where the electroconductivity is short only with the polymer material, the film deposition rate can be controlled by adding an ion that does not influence the film deposition, such as an $NH_4^+$ ion and a $Cl^-$ ion. In general, the electroconductivity of the electrolytic solution is increased by adding a supporting electrolyte. A supporting electrolyte that is generally used in the field of electrochemistry can be used in the invention, such as an alkali metal salt, e.g., NaCl and KCl, ammonium chloride, ammonium nitrate, and a tetraalkylammonium salt, e.g., tetraethylammonium perchlorate ($Et_4NClO_4$).

Furthermore, the pH of the electrolytic solution also influences the formation of the thin film. For example, in the case where the film deposition is carried out under conditions where the solubility of the film forming molecules is saturated before forming the thin film, redissolution of the film is difficult to occur after forming the thin film. However, when the film formation is carried out at pH of a solution in an unsaturated state, the thin film thus formed is immediately start to suffer redissolution upon termination of light irradiation. Therefore, it is preferred that the formation of the thin film is carried out by using such a solution in that the solubility of the film forming molecules is saturated by adjusting the pH of the electrolytic solution to a desired value by using an acid or an alkali.

In particular, film formation at a low voltage can be carried out by the photo-electrodeposition method by considering the relationship between the pH of the electrolytic solution and the starting point of deposition and by using an electrolytic solution having hysteresis characteristics.

In the ordinary electrodeposition coating method, an applied voltage of 70 V or higher is used, and the pH of the electrolytic solution is set at such a level that is considerably higher than the starting point of deposition of the electrodeposition material, whereby the irreversible reaction based on the Kolbe reaction is caused on an electrodeposition substrate to attain film formation. However, as a result of formation of bubbles in the film formation using high voltage application, the distribution of electric field on the surface of the electrode becomes ununiform to make the film quality of the film itself ununiform and to form unevenness on the film due to the degassing phenomenon of the bubbles, whereby a minute pattern excellent in resolution and smoothness cannot be formed with high reproducibility. In this case, even when the voltage is simply lowered, the film immediately suffers redissolution upon termination of the voltage application, and thus a minute pattern with high resolution cannot be formed.

In the case where the electrolytic solution having the characteristics described in the foregoing is used, on the other hand, such advantages can be obtained in that a film is easily deposited by application of a low voltage, and redissolution does not immediately occur upon termination of the voltage application. The voltage application referred herein means a photovoltaic force caused in the photosemiconductor thin film by irradiation of light, or in alternative, the sum of that photovoltaic force and a bias voltage auxiliarlily added thereto. The applied voltage is generally 9 V or less, and preferably 5 V or less. In the case where the film formation can be carried out only by the photovoltaic force, no bias voltage is necessary. (In the case where such a bias voltage is applied that is higher than the voltage depending on the band gap of the semiconductor used, there is a problem in that the Schottky barrier between the semiconductor and the solution necessary for forming the photovoltaic force is broken, and thus there is a limitation in the bias voltage that can be applied.)

The production process of the microlens array master of the invention utilizes the foregoing film deposition methods (i.e., the photo-electrodeposition method and the photocatalytic film deposition method). In the film deposition by these methods, the thickness of the film obtained corresponds to the amount of light irradiated on the photosemiconductor thin film, and by using such a phenomenon, the selected region of the photosemiconductor thin film is irradiated with the prescribed amount of light to form such a film thickness that corresponds to the cross sectional shapes of the respective microlenses.

The selective irradiation of light on the photosensitive thin film is carried out by light irradiation through a photomask or by laser light irradiation. For example, in the case where light irradiation is carried out through a photomask having circular parts, through which light is transmitted (hereinafter sometimes referred to as opening parts), the intensity of light irradiated on the photosemiconductor thin film forms a difference in exposure intensity between the peripheral part and the central part within the respective circular opening parts, i.e., the light intensity in the peripheral part is smaller than the light intensity of the central part. Therefore, with respect to the photovoltaic force caused on the photosemiconductor thin film, such a difference in photovoltaic force is also caused between the peripheral part and the central part within the respective circular opening parts, whereby a difference in thickness of the film thus formed is caused corresponding thereto. As a result, in the film pattern thus obtained, lens-like shapes are formed, which have circular planar shapes with the thickness on the cross sectional shapes thereof being decreased from the central part to the peripheral part.

The cross sectional shape or the curvature of the lens-like cross section can be freely controlled by providing such gradation in the photomask that the intensity of light transmitted through the circular opening part is decreased from the central part of the circular opening part to the peripheral part thereof. For example, minute dots blocking light are formed on the circular opening part of the photomask, and at this time, the density of the dots is decreased from the peripheral part of the opening part to the central part thereof, whereby such a intensity of light transmitted through the opening part can be obtained that is decreased from the central part to the peripheral part. The distribution of the dot density can be adjusted to obtain the film thickness corresponding to the curvature of the lens.

The selective light irradiation on the photosemiconductor thin film may also be carried out with laser light. At this time, irradiation is carried out with such an irradiation intensity of the laser light that varies to form a film thickness corresponding to the lens shape or the curvature, whereby the shape of a microlens array having the prescribed lens shape or the curvature can be obtained.

Furthermore, the intended lens shape pattern can also be obtained by using laser light having intensity distribution that changes corresponding to the prescribed lens shape pattern, for example a Gaussian beam of laser light, which is a laser beam having light intensity decreasing from the central part of the beam to the peripheral part thereof.

Figure 3:
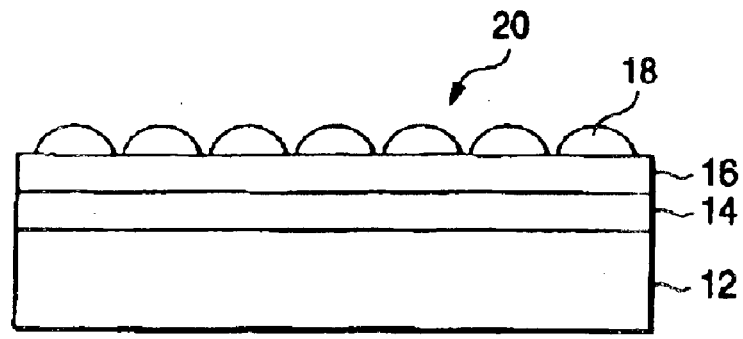
FIG. 3 is a conceptual cross sectional view showing an example of a substrate for forming a microlens array master.

FIG. 3 shows an example of a microlens array master produced in the foregoing process. In the figure, numeral 20 denotes the microlens array master, 12 denotes the insulating substrate, 14 denotes the electroconductive thin film, 16 denotes the photosemiconductor thin film, and 18 denotes the layer having a microlens array shape formed by the photo-electrodeposition method or the like method.

Figure 4:
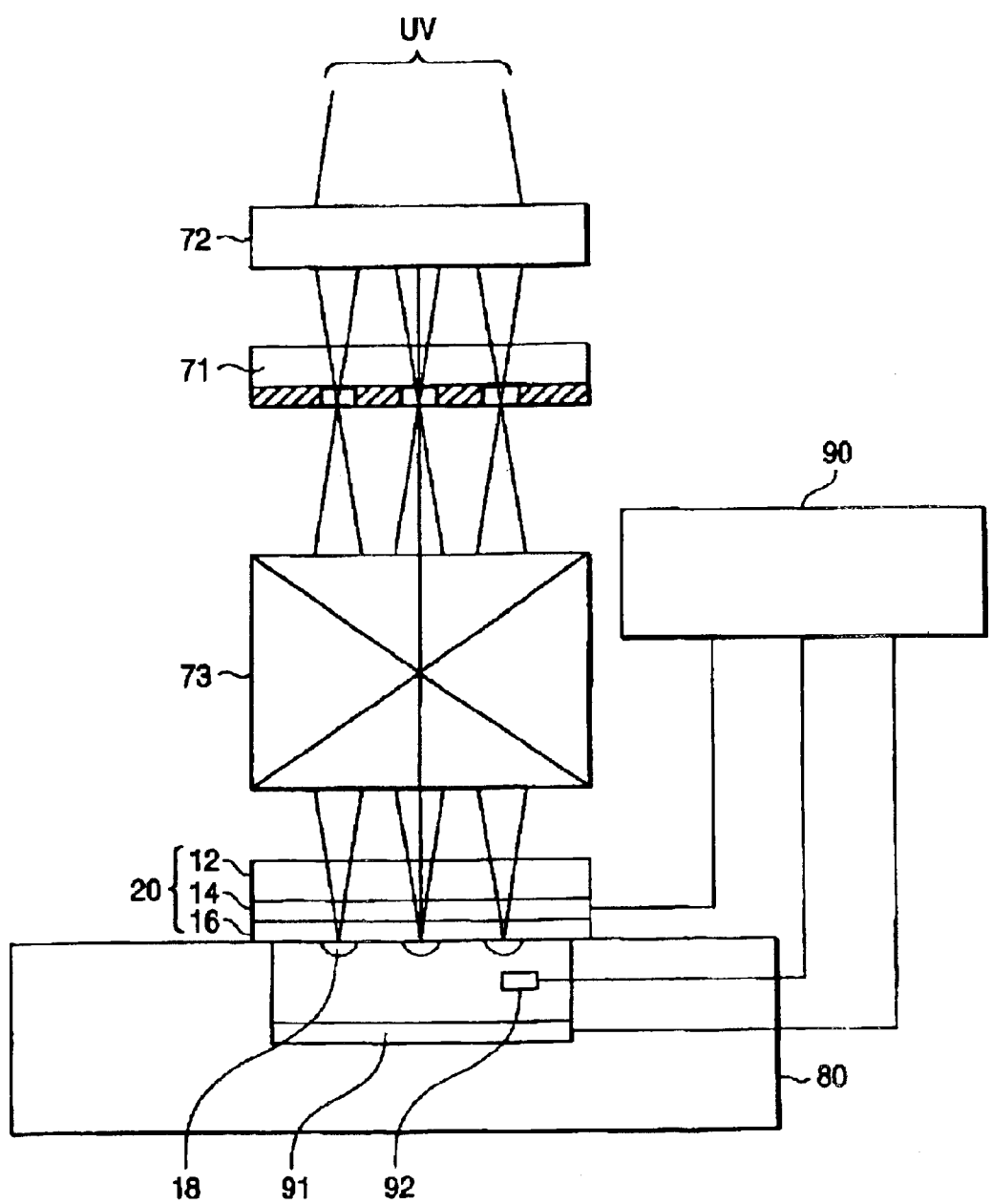
FIG. 4 is a conceptual view showing an example of an apparatus for producing a microlens array master.

An apparatus for producing a microlens array master of the invention will be described. FIG. 4 is a conceptual view showing an example of an apparatus for producing a microlens array master, by which a microlens array master is produced by the photo-electrodeposition method using a photomask. The apparatus for producing a microlens array master shown in FIG. 4 has a light source (not shown in the figure) for irradiating an ultraviolet ray, an image formation optical system containing a first image formation optical lens 72 and a second image formation optical lens 73; a photomask 71 inserted between the first image formation optical lens and the second image formation optical lens; an electrodeposition bath 80 having an electrolytic solution contained therein; a unit for applying voltage 90, such as a potentiostat; a counter electrode 91; and a reference electrode 92, such as a saturated calomel electrode. In the apparatus for producing a microlens array, a mirror reflection optical system may be used instead of the image formation optical system. As shown in FIG. 4, a substrate for forming a microlens array master 20 is arranged in the electrodeposition bath. The pattern exposure can be focused on the photosemiconductor thin film by using the foregoing projection optical system, and a minute microlens array master can be formed with a short period of exposure time. In the case where the necessary electrodeposition voltage can be obtained only by the photovoltaic force, the units for applying voltage are not necessary.

In the image formation optical system, the distance between the second image formation optical lens and the surface of the light transmitting substrate is preferably from 1 mm to 50 cm from the standpoint of handling, and the focal depth of the second image formation optical lens is preferably from ±10 to ±100 μm from the standpoint of accuracy and handling.

In the case where the photomask and the photosemiconductor thin film are close to each other, there is no necessity to use such an apparatus that is equipped with an exposure device having the image formation optical system or the mirror reflection optical system, but the light irradiation can be carried out by a collimating light exposure device or a contact type exposure device. Examples of the light source for irradiation include a uniform irradiation light source of Hg—Xe. For example, the photomask is made in contact with the substrate for forming a microlens array master, or in addition, the thickness of the insulating substrate is made 0.2 mm or lens, to prevent diffraction of light, whereby a microlens array master having a high density can be produced.

In the case where the exposure time may be prolonged, the light irradiation can be carried out by using an inexpensive scanning laser writing device. While not shown in the figure, a scanning laser writing device for laser irradiation, such as an He—Cd laser, can be used instead of the exposure device shown in the figure. In this case, a Gaussian beam, i.e., a beam having a larger light intensity at the central part decreasing toward the peripheral part, is used as the laser light beam, and the laser light is turned on and off with a prescribed interval, whereby microlenses having curvatures determined by the beam diameter can be formed in the form of an array by irradiating the laser light on the prescribed positions.

Moreover, a proximity type exposure device can also be used within the permitted range of pattern resolution.

The exposure in the apparatus for producing a microlens array master has been described for the case where the exposure is carried out from the side of the insulating substrate of the substrate forming a microlens array master, but the exposure may be carried out from the side of the photosemiconductor thin film. In the case where the exposure is carried out from the side of the photosemiconductor thin film, the substrate is immersed in the electrolytic solution, but because the electrolytic solution used in the invention does not absorb an ultraviolet ray used as the irradiated light herein, the exposure of the photosemiconductor thin film can be carried out through the electrolytic solution. However, in the case of a large film thickness, the formation of the lens shape may be difficult due to the non-negligible absorption of light, and it is preferred that the exposure is carried out from the side of the insulating substrate.

In the case where an electromotive sufficient for the electrodeposition can be obtained with the photosemiconductor in the photo-electrodeposition method, no bias voltage is necessarily applied by the voltage applying device.

In FIG. 4, the voltage applying device is connected to the electroconductive thin film, and the photosemiconductor thin film functions as a working electrode.

As the apparatus for producing a microlens array master by the photocatalytic film deposition method, that used for the photo-electrodeposition method can also be used, provided that there is no necessity to apply a voltage between the counter electrode and the member capable of applying a bias voltage. In alternative, an apparatus having such a structure may be used that is obtained by removing the unit for applying a voltage, the counter electrode and the reference electrode from the foregoing apparatus. Upon producing a microlens array master by using the apparatus, it is necessary that the electroconductive thin film of the substrate for forming a microlens array master is electrically connected to the electrolytic solution.

Production of Template

A template is produced by forming a layer of a template resin material on the film deposition surface of the microlens array master, and the layer is released therefrom.

It is preferred that the template resin material can be easily released from the microlens array master and has at least a certain level of mechanical strength and dimensional stability as being used as a template (which is repeatedly used). The layer of the template resin material is formed with the template resin material, to which various kinds of additives may be added depending on necessity.

Because it is necessary that the resin for forming the template is sufficiently penetrated into narrow gaps among the respective microlenses formed on the master, the resin preferably has a viscosity of a certain level or lens, for example, it preferably has a viscosity of about from 10 to 2,000 mP.s. A solvent may be added thereto for adjusting the viscosity in such an amount that causes no adverse affect due to the solvent.

As the resin for forming a template, a curable silicone resin (including a thermosetting type and a room temperature curing type), in particular a curable polydimethylsiloxane resin, is preferably used from the standpoint of releasing property, mechanical strength and dimensional stability. A low molecular weight liquid resin of the silicone resin is preferably used because sufficient permeability is expected.

It is preferred that the master is subjected to a releasing treatment, such as coating of a releasing agent, to facilitate release of the template.

Upon forming the layer of the template resin material on the film deposition surface of the microlens array master, for example, a layer of the resin for forming the template is formed by coating or casting the resin for forming the template on the surface, and then the layer is subjected to a drying treatment and a curing treatment depending on necessity.

The thickness of the layer of the template resin material may be appropriately determined under consideration of handling as a template and is preferably about from 1 to 50 mm.

Thereafter, the layer of the template resin material is released from the microlens array master to obtain the template.

Production (Duplication) of Microlens Array

A layer of a microlens array resin material having a controlled refractive index is then formed on the template produced in the preceding process step, and the template is released from the layer to duplicate the microlens array.

The layer of the microlens array resin material is formed with a resin for forming a microlens array. As the resin for forming a microlens array, any polymer material that has light transmittance necessary for using as a lens can be used without limitation. In general, a polymer material has a refractive index of about from 1.4 to 1.6, and therefore, in order to obtain a microlens array having a higher refractive index, inorganic oxide fine particles having light transmittance and a high refractive index may be dispersed in the polymer material.

The inorganic oxide fine particles preferably have a refractive index of about from 1.8 to 2.8, and for example, $TiO_2$, $ZnO$, $ZrO_2$ and ITO can be used. Rutile type titanium oxide fine particles are preferred because the large scope of control for refractive index and the high stability thereof.

The fine particles preferably have a particle diameter of about from 1 to 30 mm. The addition amount of the fine particles may be appropriately determined under consideration of the refractive index necessary for the microlens array and the mechanical strength of the microlens array.

As the polymer material, the polymer material for electrodeposition film formation used on producing the microlens array master may be used, as well as the ordinary polymer material for an optical element. In the case where the polymer material for electrodeposition film formation has a hydrophobic group, the hydrophobic group has a capability of adsorbing the fine particles for controlling the refractive index and thus has a function of uniformly dispersing the fine particles for controlling the refractive index in the polymer material for electrodeposition film formation. Therefore, a microlens array having good optical properties can be obtained from the combination of the polymer material for electrodeposition film formation containing a hydrophobic group and the resin material for forming a microlens array containing the fine particles for controlling the refractive index.

Upon practically designing the lenses, the refractive indexes of the polymer material and the inorganic oxide fine particles vary depending on materials used, and therefore, it is necessary that the transmittance and the wavelength necessary for application are determined through strict simulation.

It is necessary that the resin for forming a microlens array is sufficiently penetrated into fine cavities of the template, and therefore, it preferably has a sufficiently low viscosity. A solvent may be added thereto for adjusting the viscosity in such an amount that causes no adverse affect due to the solvent.

As the resin for forming a microlens array, a low viscosity material exhibiting high permeability, such as a low molecular weight curable resin, such as a thermosetting resin and a photocurable resin, is preferably used. The curable resin is coated or cast on the template and then subjected to thermal curing or photocuring to form a layer of the microlens array resin material. At this time, in order to adjust the refractive index of the cured resin material, the fine particles for controlling the refractive index may be added to the curable resin.

In order to improve the light transmittance of the microlens array thus produced, a reflection preventing film is preferably provided on the surface of the microlens array. As the material for the reflection preventing film, $SiO_2$ having a low refractive index is preferably used. In general, the optical thickness of the film in contact with the air, which is expressed by a product of the thickness and the refractive index of the film, is preferably ¼ of the wavelength near the center of the visible region or integral multiple of the wavelength. Therefore, in order to obtain transparency in the visibile region (wavelength: 400 to 700 nm), the center wavelength of which is 550 nm, with $SiO_2$ having a refractive index of 1.43, the thickness of the reflection preventing film is preferably 96 nm or integral multiple of 96 mm.

EXAMPLE

The invention will be described in more detail below with reference to the examples, but the invention is not construed as being limited thereto.

Example 1

Production of Microlens Array Master

On a non-alkali glass (7059 glass) substrate having a thickness of 0.4 mm, an ITO film having a thickness of 75 nm and an anatase type titanium oxide thin film having a thickness of 110 nm are formed by the RF sputtering method to produce a substrate for forming a microlens array master (see FIG. 2).

An electrolytic solution for electrodeposition is prepared. The electrolytic solution contains 3% by weight of a styrene-acrylic acid copolymer (molecular weight: 13,000, polymerization ratio of the styrene and acrylic acid: 65/35 by mole, acid value: 150) and 10% by weight of ethylene glycol, and is adjusted to have pH 7.8 and an electroconductivity of 6 mS/cm with tetramethylammonium hydroxide and ammonium chloride.

The tripolar electrodeposition apparatus is generally used in the field of electrochemistry, is used, and the $TiO_2$ thin film of the substrate for forming a microlens array master is used as a working electrode with respect to a saturated calomel electrode.

A projection type exposure apparatus produced by Ushio, Inc. (intensity of light having wavelength of 365 nm: 100 mW/cm$^2$) is used as an exposure apparatus. The apparatus is adjusted, whereby the light from the first image formation lens once forms an image on a photomask and then forms an image on the surface of the titanium oxide thin film formed on the back surface of the substrate through the second image formation lens. The distance between the second image formation lens and the image forming surface is 10 cm, and the focal depth is ±50 μm.

A bias voltage of 1.8 V is applied between the counter electrode and the working electrode by using a potentiostat, and simultaneously, the back surface of the substrate is irradiated with ultraviolet ray for 30 seconds, so as to obtain a microlens array master having a lens pattern of a transparent resin formed on the region of the surface of the $TiO_2$ thin film irradiated with light.

The lens diameter is 30 μm, and the curvature radius is 20 μm in the master. The density of the lenses is $1.28 \times 10^5$ per square centimeter.

Production of Template

A releasing agent is coated on the microlens array master, and then a polydimethylsiloxane resin (SYLGARD 184, produced by Dow Corning Asia, Inc.), which is a thermosetting silicone resin, is cast thereon. The resin is cured by heating to 120° C. for 30 minutes and then released therefrom to obtain a template. The thickness of the template is 2 mm.

Production of Microlens Array

A titanium oxide aqueous dispersion (solid content: 44% by weight) of rutile type titanium oxide fine particles (particle diameter: 15 mm, refractive index: 2.7) and a styrene-acrylic acid copolymer (molecular weight: 13,000, copolymerization ratio of styrene and acrylic acid: 65/35 by mole, acid value: 150) dispersed at a volume ratio of 1/1.3 is cast on the template formed with the cured silicone resin and is cured by heating at 100° C. for 10 minutes, followed by releasing the template, so as to produce a duplicate of a microlens array (thickness: 10 μm). The microlenses thus duplicated have a refractive index of 1.75.

Example 2

A microlens array is produced in the same manner as in Example 1 except that the microlens array resin material used upon production of the microlens array is changed to a titanium oxide aqueous dispersion (solid content: 44% by weight) of rutile type titanium oxide fine particles (particle diameter: 15 nm, refractive index: 2.7) and a styrene-acrylic acid copolymer (molecular weight: 13,000, copolymerization ratio of styrene and acrylic acid: 65/35 by mole, acid value: 150) dispersed at a volume ratio of 1/5. The microlenses of the microlens array thus obtained have a refractive index of 1.64.

In the process for producing a microlens array of the invention, a microlens array matter is produced in a simple method with low cost, a template is produced from the matter, and a microlens array is duplicated and produced by using the template. Therefore, a large number of microlens arrays can be efficiently mass-produced by using the template with low cost.

The master is produced by the photo-electrodeposition method (including the photocatalytic method), and in the film formation by these methods, the resulting film thickness corresponds to the amount of light irradiated on the photosemiconductor thin film. Therefore, a selected region of the photosemiconductor thin film is irradiated with a prescribed amount of light adjusted to form a film thickness corresponding to the cross sectional shapes of the respective microlenses, whereby a microlens array master having a prescribed cross sectional shape can be conveniently produced. Furthermore, owing to the use of the photo-electrodeposition method, it is easy that the pattern density of the master is increased, the density is arbitrarily controlled, a minute pattern is formed with high resolution, and the pattern is arbitrarily controlled including complex patterns. The respective microlenses of the resulting master have refined shapes.

Accordingly, in a microlens array produced by using the master, the density is high, the density can be arbitrarily controlled, a minute pattern is formed with high resolution, and the pattern can be arbitrarily controlled including complex patterns. The respective microlenses of the microlens array have refined shapes. Furthermore, the lenses exhibit a high light condensing efficiency.

The entire disclosure of Japanese Patent Application No. 2002-186057 filed on Jun. 26, 2002 including specification, claims, drawings and abstract is incorporated herein by reference in its entirety.

What is claimed is:

1. A process for producing a microlens array comprising the steps of:

arranging a master substrate having an insulating substrate, an electroconductive thin film and a photosemiconductor thin film in this order;

preparing an aqueous electrolytic solution containing a film forming material having a solubility or dispersibility in an aqueous liquid decreasing upon changing pH;

forming a microlens array master by contacting the photosemiconductor thin film with the aqueous electrolytic solution and irradiating the photosemiconductor thin film with a light so as to induce the pH change of the electrolytic solution enough to selectively deposit the film forming material on the master substrate;

forming a layer of a template resin material on a surface of the master and releasing the layer therefrom to produce a template; and forming a layer of a microlens array resin material having a controlled refractive index on the template; and releasing the template therefrom to produce a microlens array.

2. The process for producing a microlens array as claimed in claim 1, wherein the photosemiconductor thin film is irradiated with light through a photomask.

3. The process for producing a microlens array as claimed in claim 2, wherein the photomask has gradation of light transmittance in a light transmitting part.

4. The process for producing a microlens array as claimed in claim 1, wherein the photosemiconductor thin film is irradiated with laser light.

5. The process for producing a microlens array as claimed in claim 4, wherein the laser light has an intensity distribution that changes corresponding to a prescribed lens shape pattern.

6. The process for producing a microlens array as claimed in claim 4, wherein the laser light is a Gaussian beam.

7. The process for producing a microlens array as claimed in claim 1, wherein the photosemiconductor thin film is a titanium oxide thin film.

8. The process for producing a microlens array as claimed in claim 7, wherein the titanium oxide thin film contains an anatase crystal structure.

9. The process for producing a microlens array as claimed in claim 1, wherein the microlens array resin material contains inorganic oxide fine particles having light transmittance and a high refractive index.

10. The process for producing a microlens array as claimed in claim 9, wherein the inorganic oxide fine particles are rutile type titanium oxide fine particles.

11. The process for producing a microlens array as claimed in claim 1, wherein the layer of the template resin material is a layer of a cured curable silicon resin.

12. The process for producing a microlens array as claimed in claim 1, wherein the process further comprises a step of providing a reflection preventing film on a microlens array thus produced.

13. A process for producing a microlens array comprising the steps of:

arranging a master substrate having an insulating substrate, an electroconductive thin film and a photosemiconductor thin film in this order;

preparing an aqueous electrolytic solution containing a film forming material having a solubility or dispersibility in an aqueous liquid decreasing upon changing pH;

forming a microlens array master by contacting the photosemiconductor thin film and the electroconductive thin film with the aqueous electrolytic solution and irradiating the photosemiconductor thin film with a light so as to induce the pH change of the electrolytic solution enough to selectively deposit the film forming material on the master substrate;

forming a layer of a template resin material on a surface of the master and releasing the layer therefrom to produce a template; and forming a layer of a microlens array resin material having a controlled refractive index on the template and releasing the template therefrom to produce a microlens array.

14. An electrolytic solution used in a process for producing a microlens array as claimed in claim 1, the film forming material being a polymer material containing a hydrophobic group and a hydrophilic group with a number of the hydrophobic group being in a range of from 30 to 80% based on the total number of the hydrophilic group and the hydrophobic group.

15. A microlens array resin material used in a process for producing a microlens array as claimed in claim 1, the polymer material comprising a hydrophobic group and a hydrophilic group with a number of the hydrophobic group being in a range of from 30 to 80% based on the total number of the hydrophilic group and the hydrophobic group.

16. The microlens array resin material as claimed in claim 15, wherein the resin material further comprises inorganic oxide fine particles having light transmittance and a high refractive index.

17. A process for producing a microlens array forming master comprising the steps of:

arranging a master substrate having an insulating substrate, an electroconductive thin film and a photosemiconductor thin film in this order;

preparing an aqueous electrolytic solution containing a film forming material having a solubility or dispersibility in an aqueous liquid decreasing upon changing pH; and forming a microlens array master by contacting the semiconductor with the aqueous electrolytic solution and irradiating the photosemiconductor thin film with a light so as to introduce the pH change of the electrolytic solution enough to selectively deposit the film forming material on the master substrate.

* * * * *